United States Patent [19]

Tseng

[11] Patent Number: 5,599,736
[45] Date of Patent: Feb. 4, 1997

[54] FABRICATION METHOD FOR POLYSILICON CONTACT PLUGS

[75] Inventor: Horng-Huei Tseng, Hsin chu, Taiwan

[73] Assignee: Vanguard International Semiconductor Corporation, Hsin-Chu, Taiwan

[21] Appl. No.: 496,013

[22] Filed: Jun. 28, 1995

[51] Int. Cl.⁶ .................................................. H01L 21/28
[52] U.S. Cl. ......................... 437/186; 437/191; 437/195; 437/203; 437/233
[58] Field of Search ........................... 437/186, 195, 437/191, 205, 233, 967

[56] References Cited

U.S. PATENT DOCUMENTS

| | | | |
|---|---|---|---|
| 5,183,781 | 2/1993 | Nakano | 437/191 |
| 5,196,373 | 3/1993 | Beasom | 437/203 |
| 5,231,052 | 7/1993 | Lu et al. | 437/190 |
| 5,244,835 | 9/1993 | Hochiya | 437/186 |
| 5,286,668 | 2/1994 | Chou | 437/52 |
| 5,316,978 | 5/1994 | Boyd et al. | 437/203 |

FOREIGN PATENT DOCUMENTS

| | | |
|---|---|---|
| 01243526 | 9/1989 | Japan . |
| 04072630 | 3/1992 | Japan . |
| 05109646 | 4/1993 | Japan . |

*Primary Examiner*—John Niebling
*Assistant Examiner*—Thomas G. Bilodeau
*Attorney, Agent, or Firm*—George O. Saile

[57] ABSTRACT

A method for fabricating a polysilicon plug, to connect overlying metallizations, to underlying active device regions, has been developed. This process features filling a contact hole, to active device regions, with intrinsic polysilicon, and converting the intrinsic polysilicon to doped polysilicon, in all areas excluding the contact hole. The doped polysilicon is then selectively removed, leaving only the contact hole filled with intrinsic material. A doping process is then emoployed to lower the resistivity of the polysilicon in the contact hole.

23 Claims, 4 Drawing Sheets

FABRICATION METHOD FOR POLYSILICON CONTACT PLUGS

BACKGROUND OF THE INVENTION (1) Field of the Invention

The present invention relates to the fabrication methods used for semiconductor devices, and more specifically to an optimized process for creating the interconnecting contact stud, between the active device region and the overlying metallization.

(2) Description of Prior Art

The trend in the semiconductor industry has been to manufacture silicon chips, featuring increasing device density and performance, while still however reducing, or maintaining costs. This has been accomplished by the ability of the semiconductor industry to continually reduce the size of device features, thus enabling greater densities to be achieved. The decreasing device dimensions have also benefitted performance objectives, in terms of allowing reduced capacitances and resistances to be realized.

The ability of the semiconductor industry to reduce critical device dimensions, to the sub-micron range, has largely been attributed to advances in several key semiconductor fabrication disciplines. For example achievements in photolithography, via the use of more sophisticated exposure cameras, as well as the development of more sensitive photoresist materials, have allowed micro-miniaturazation to proceed. In addition the rapid development of anisotropic dry etching procedures have allowed the sub-micron images, in masking photoresist, to be successfully transferred to underlying materials used in silicon chip fabrication processes. Other semiconductor fabrication disciplines, such as ion implantation as well as low pressure chemical vapor deposition, (LPCVD), have also been major contributors to the attainment of micro-miniaturazation.

Although these now achievable smaller devices can easily be manufactured, directly reducing cost and improving performance, specific vulnerabilities, in terms of reliability can exist. For example, contact studs, used to interconnect specific silicon device regions to overlying metallizations, can now be formed with diameters in the range of 0.25 to 0.50 micrometers. This reduction in the dimension of a critical device feature, although offering denisty improvements, also can create reliability concerns. For example if an aluminum based metallurgy were used for filling the narrow diameter contacts, the current density in the aluminum filled hole may exceed the capabilities of this material and lead to electromigration failures. In addition the solubility of silicon in aluminum, can lead to deletrious penetration failures, during subsequent processing heat treatments.

A material that can be used to successfully fill these small contact holes, without reliability, or penetration risks, is polysilicon. The current carrying capability of this material, and the ability to reduce the resistance of polysilicon, via conventional doping techniques, suggest this materitel as a excellent candidate for filling narrow contact holes. The problem the industry has been attempting to overcome, when using polysilicon contacts, is the ability to remove the unwanted material from areas other then the contact hole region. For example Bersom, et al, in U.S. Pat. No. 5,196,373, and Nakamo, et al, in U.S. Pat. No. 5,183,781, describe polysilicon contact processes, however without showing exact details needed to execute the fabrication of this structure. In addition Boyd, et al, in U.S. Pat. No. 5,316,998, show a polysilicon contact process using a chemical mechanical polishing procedure, used to remove the unwanted residual material. However this process, in addition to being complex, also can add significant cost to the process. This invention will describe a novel process, used to create a polysilicon contact, to a silicon device region, which is easy to implement, and without exhibiting significant process complexity or cost increases.

SUMMARY OF THE INVENTION

It is an object of this invention to provide a method of fabricating a polysilicon contact plug to active silicon device elements.

It is another object of this invention to fill the contact hole with intrinsic polysilicon.

It is yet another object of this invention to convert the unwanted intrinsic polysilicon to doped polysilicon.

It is still yet another object of this invention to remove the unwanted, or doped polysilicon, via selective phosphoric acid treatment.

In accordance with this present invention a method is described for fabricating a polysilicon contact plug, to an active silicon device region, in a semiconductor substrate. A contact hole is opened, in a dielectric composite, silicon nitride—silicon oxide layer, to an active device region in silicon. An intrinsic layer of polysilicon is deposited to a thickness that allows for complete filling of the contact hole. Doping processes are employed to convert the unwanted intrinsic polysilicon, in regions outside the contact hole, to a heavily doped, N type, polysilicon region. A selective wet etchant is then used to remove only the unwanted, heavily doped regions, of polysilicon, leaving only intrinsic polysilicon in the contact hole. A doping procedure is next used to increase the conductivity of the polysilicon in the contact hole.

DESCRIPTION OF THE PREFERRED EMBODIMENTS

The method of forming semiconductor devices, with polysilicon contact plugs, will now be covered in detail. This polysilicon contact plug can be used as part of metal oxide semiconductor field effect transistors, (MOSFET), devices that are currently being manufactured in industry, therefore only the specific areas unique to understanding this invention will be covered in detail.

Figure 1:
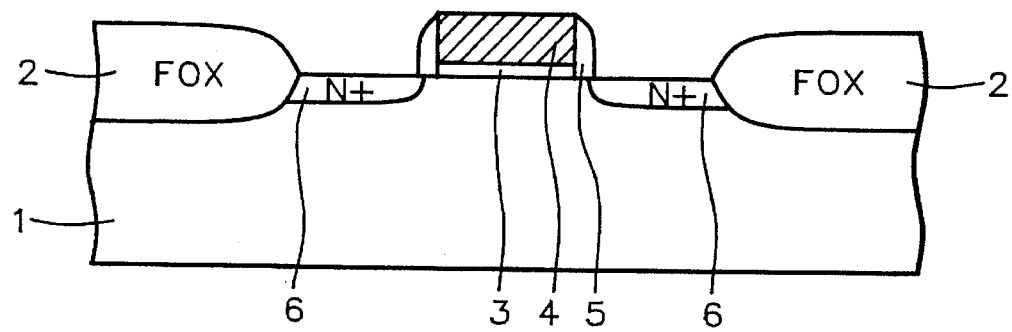
FIGS. 1–8 are schematic, cross-sectional views showing the process of the invention.

FIG. 1 shows a typical NFET, (N type Field Effect Transistor), to which the polysilicon contact plug process will be used with. A substrate, 1, composed of P type, single crystal silicon, with a <100> orientation, is used. A thick field oxide region, 2, (FOX), is formed surrounding the region where the device is to be built. Briefly the method used to create the FOX regions is to form the desired device pattern in a silicon nitride—silicon dioxide dielectric composite. The silicon dioxide is obtained via thermal oxidation processing, while the overlying silicon nitride layer is deposited using LPCVD processing. Standard photolithographic and reactive ion etching, (RIE) techniques are used to create the desired oxidation mask pattern in the composite dielectric. After photoresist removal, via oxygen plasma ashing, followed by careful wet cleans, the FOX region is created via thermal oxidation, to a thickness between about 4000 to 6000 Angstroms. The composite dielectric is next removed using hot phosphoric acid, for the silicon nitride layer, while a buffered hydrofluoric acid solution is used to remove the underlying silicon dioxide layer. Next a silicon dioxide film, used as a gate oxide, 3, is formed via thermal oxidation, at a temperature between about 850° to 950° C., to a thickness between about 70 to 850 Angstroms. The process continues with the growth of a polysilicon layer, 4, obtained using LPCVD processing, at a temperature between about 550° to 700° C., to a thickness between about 2000 to 4000 Angstroms. An ion implantation procedure, using phosphorous at an energy between about 50 to 100 Kev., at a dose between about 1E13 to 5E14 atoms/cm2, is used to dope the polysilicon layer. Standard photolithographic and RIE processing, using an SF6 chemistry, are next employed to create the polysilicon gate structure, 4, shown schematically in FIG. 1.

Another LPCVD process, using tetraethylorthosilicate as a source, is used to deposit a silicon oxide layer, 5, at a temperature between about 500° to 700° C., to a thickness between about 2000 to 4000 Angstroms. Anisotropic, selective RIE processing, using CF4 and H2, are used to create silicon oxide, sidewall spacer, 5. The source and drain regions, 6, are next formed via ion implantation of arsenic, at an energy between about 50 to 100 Kev., at a dose between about 1E14 to 1E15 This is also shown in FIG. 1.

Figure 2:
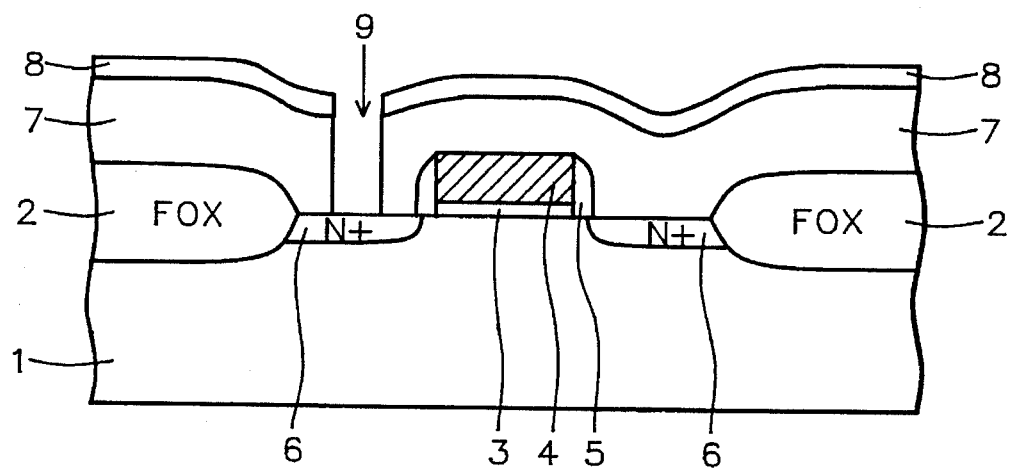

A silicon oxide layer, 7, is now deposited using LPCVD, or atmospheric pressure chemical vapor deposition, (APCVD), at a temperature between about 400° to 800° C., to a thickness between about 6000 to 1200 Angstroms, followed by LPCVD deposition of silicon nitride layer, 8, at a temperature between about 600° to 800° C., to a thickness between about 500 to 3000 Angstroms, using NH3 and SiH4, at a pressure between about 300 to 400 mtorr. This is seen in FIG. 2. Standard photolitographic procedures are then used to expose a region of the silicon nitride—silicon oxide layers, followed by a RIE procedure, used to open contact hole 9, in the dielectrics, and exposing source and drain region 6, in the substrate. A Cl2 chemistry was used to etch silicon nitride layer, 8, while a CF4–CHF3 etchant was used for opening silicon oxide layer, 7. Photoresist removal, again via the use of oxygen plasma ashing, followed by careful wet cleans, to remove any native form the surface of region, 6, in the opened contact hole, 9, are then performed.

Figure 3:
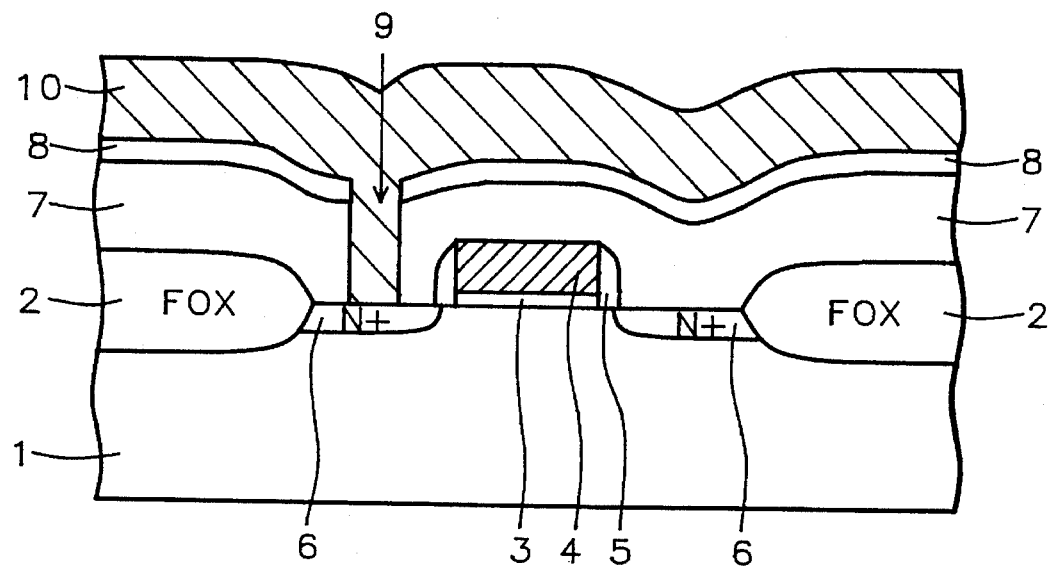

A deposition of polysilicon, 10, using LPCVD processing is next performed and shown in FIG. 3. The intrinsic polysilicon deposition is carried out at a temperature between about 500° to 700° C., to a thickness between about 1000 to 4000 Angstroms. It is critical to deposit a thick enough layer of polysilicon to completely fill contact hole, 9. The wet cleans, performed prior to the polysilicon deposition, used to remove native oxide from the surface of source and drain regions, 6, insure low interface resistance between the polysilicon and the underlying doped substrate regions.

Figure 4:
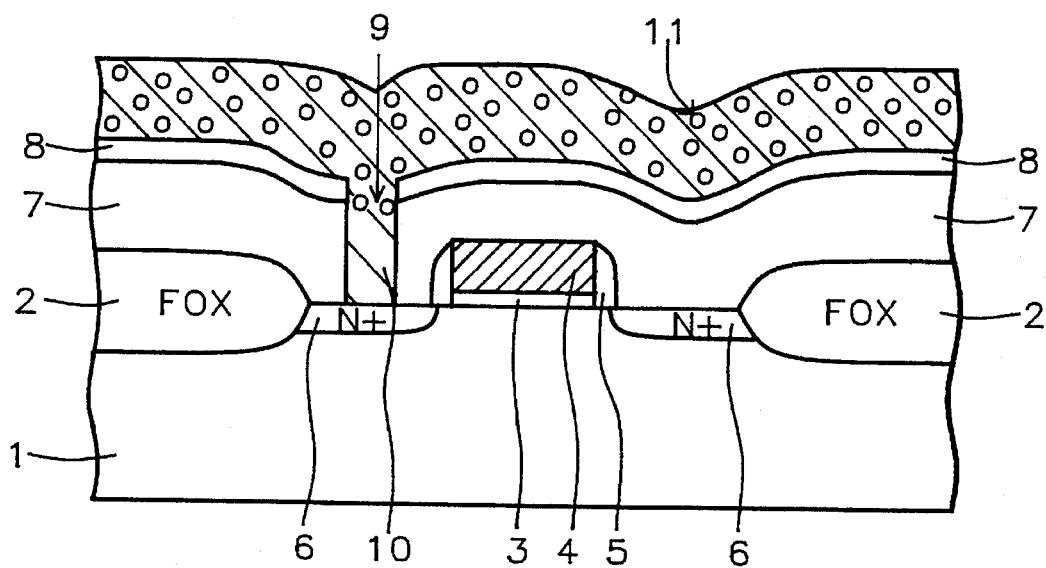

The next process sequence is critical to this invention. The polysilicon layer, 10, is subjected to various N type doping procedures, used to convert a specific thickness of polysilicon, from intrinsic to a N type doped layer. The desired amount of polysilicon, converted to an N type layer, is the total thickness of the polysilicon layer, 10, plus an additional thickness of polysilicon, equal to the thickness of silicon nitride layer, 8. This is shown in FIG. 4. It will later be described that the unwanted polysilicon, which is all the polysilicon except for the material in contact hole, 9, is removed selectively, via wet etching processing that only etches N type doped polysilicon. Therefore the critical aspect of this invention is to accurately convert the proper thickness of intrinsic polysilicon, which will not be removed with subsequent selective wet etchants, to the easily removable N type polysilicon. FIG. 4, shows the result of two processes used to accurately convert the specific thickness of intrinsic polysilicon layer, 10, to a N type polysilicon layer, 11. The first method is to use an ion implantation of arsenic or phosphorous, at an energy between about 30 to 100 Kev., at a dose between about 2E15 to 2E16 atoms/cm2. A second method used to achieve the critical doping of polysilicon is via a POCl3 process at a temperature between about 850° to 950° C. An anneal is next performed to activate the ion implanted spieces, used for the first method described, and also to aid in accurately converting the specific thickness of intrinsic polysilicon to the doped counterpart. The anneal is performed at a temperature between about 800° to 900° C. A third method used to accurately convert a specific thickness of polysilicon layer 10, to a doped layer, 11, is via deposition of an insitu doped polysilicon layer, 12, shown in FIG. 5, followed by heat treatments at a temperature between about 800° to 900° C., for a time between about 10 to 40 min., for purposes of diffusing dopant from layer 12, into layer 10, again creating polysilicon doped region 11. The insitu doped polysilicon layer, 12, is deposited using LPCVD processing, to a thickness between about 1000 to 4000 Angstroms, at a temperature between about 500° to 700° C., using between about 100 to 300 sccm of PH3 and between about 1200 to 1400 sccm of SiH4.

Figure 5:
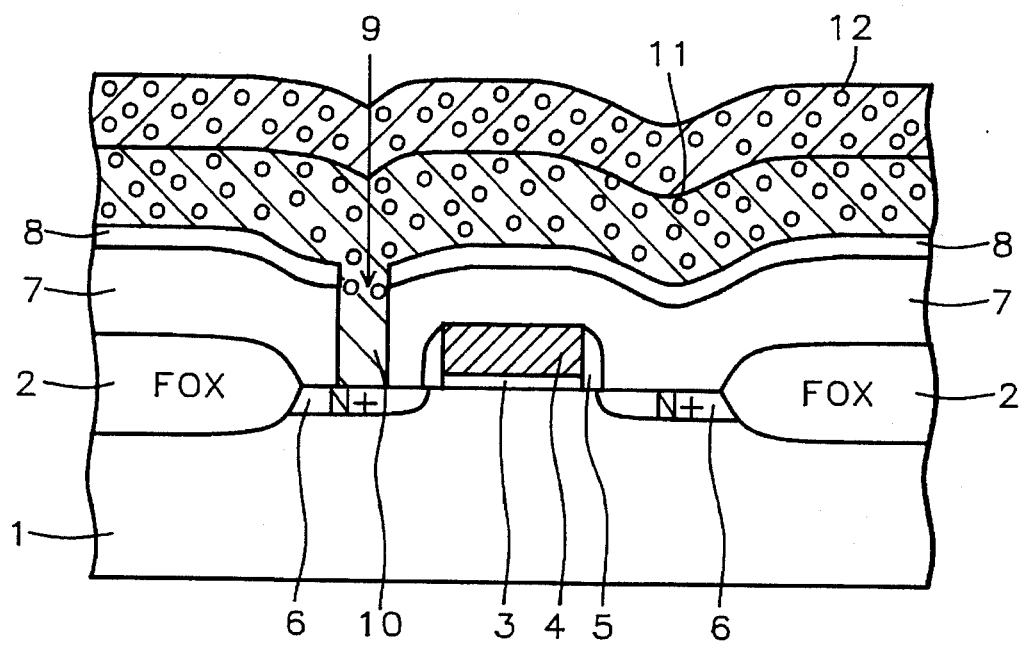
Figure 6:
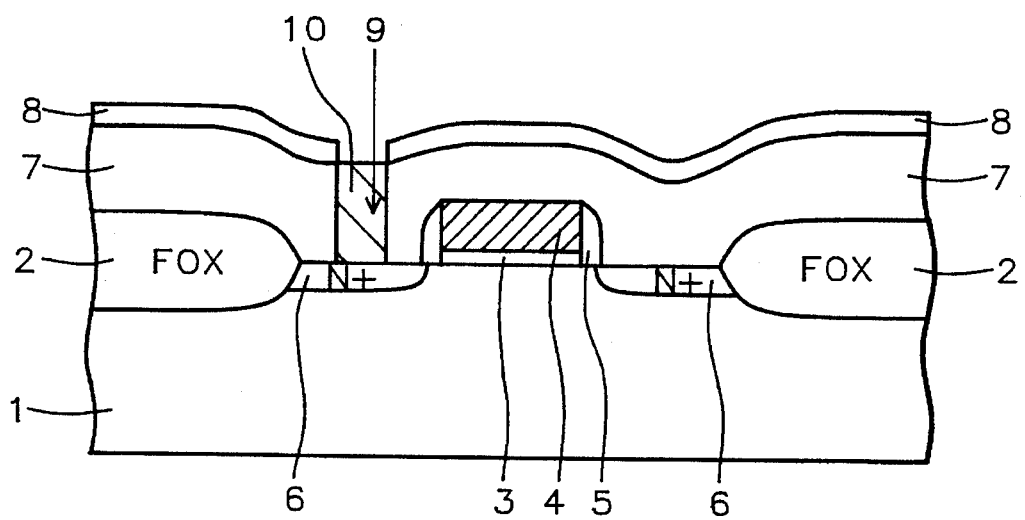

The next step is to selectively remove all doped polysilicon from the structure, leaving only intrinsic polysilicon, 10, remaining in contact hole 9. This is accomplished using a solution of phosphoric acid, at a temperature between about 160° to 180° C. It should be noted that polysilicon layer, 11, shown in FIG. 4 as well as polysilicon layers 11 and 18, shown in FIG. 5, are removed with this selective wet etchant. It should also be noted that this process for selective removal of doped polysilicon regions, avoids deletrious micro-loading effects that can occur with dry etching procedures, in small contact holes. The result of this selective removal procedure is schematically shown in FIG. 6.

Figure 7:
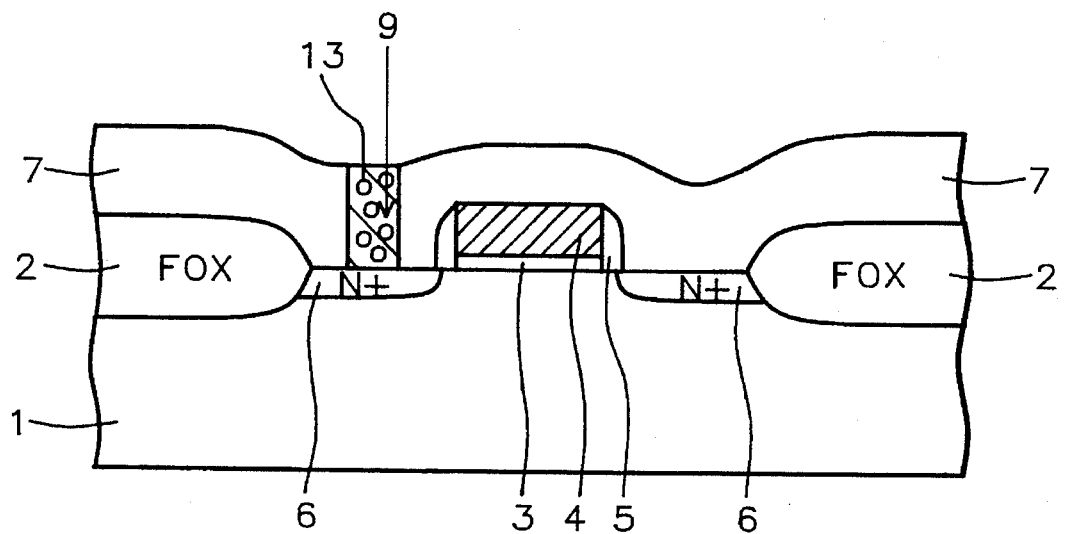

FIG. 7 shows the removal of silicon nitride layer, 8, via use of hot phosphoric acid. It can be seen that the process was designed to result in a smooth topography. To utilize the remaining polysilicon, 10, contact hole 9, as a conductive link between subsequent overlying metallizations, and underlying device regions, such as region 6, an ion implantation process using arsenic or phosphorous, is performed at an energy between about 50 to 100 Kev., at a dose between about 1E15 to 3E16 atoms/cm2. An activation anneal, at a temperature between about 800° to 900° C., is then performed, in a nitrogen ambient, to convert the undoped polysilicon plug, 10, to a doped polysilicon plug, 13, in contact hole 9. This is also shown in FIG. 7.

Figure 8:
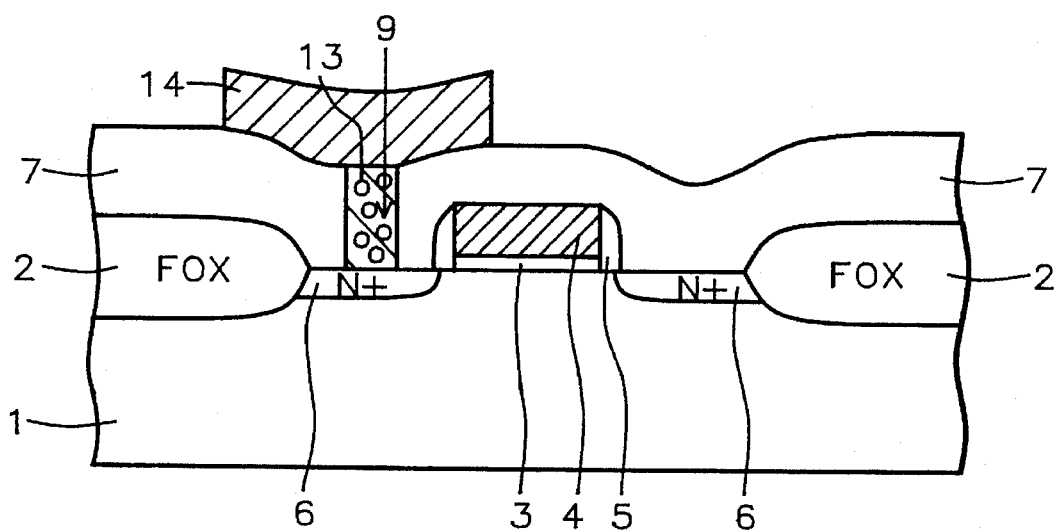

FIG. 8 illustrates an interconnect metallization, used in conjunction with the polysilicon contact plug structure. A metallization, in the form of Al—Cu, is deposited to a thickness between about 6000 to 12000 Angstroms. Standard photolithographic and RIE procedures, using a Cl2–BCl3 etchant, are used to form metal structure, 14, which allows contact to the undelying region, 6, through the doped polysilicon contact plug, 13.

This process, for fabricating polysilicon contact plugs, although shown as part of an NFET, MOS device, can be used as well in PFET devices. In addition complimentary, (CMOS), as well as BiCMOS devices can also be fabricated via use of this invention.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device on a semiconductor substrate, using a conductive plug to provide electrical contact between an active device region in said semiconductor substrate, and the interconnect metallization, comprising the steps of:

providing said MOSFET device, on said semiconductor substrate;

providing said active device region in said MOSFET device;

depositing a first dielectric layer on said semiconductor substrate, including said MOSFET device;

depositing a second dielectric layer on said first dielectric layer, to form composite dielectric layer;

photolithographic processing to open a region in photoresist, exposing said composite dielectric layer, directly overlying said active device region;

anisotropic removal of said composite dielectric layer, in said open region of said photoresist, to create a contact hole to said active device region;

cleaning surface of said active device region, in said contact hole opening;

depositing an intrinsic layer of polysilicon on said active device region, in said contact hole, and on said second dielectric layer;

a first doping of said intrinsic polysilicon layer;

a first anneal to completely convert said intrinsic polysilicon layer, on said second dielectric layer, to doped polysilicon, while converting a top portion of said intrinsic polysilicon layer, in said contact hole, to said doped polysilicon;

removal of said doped polysilicon, from surface of said second dielectric layer, and from surface of said intrinsic polysilicon layer, in said contact hole;

removal of said second dielectric layer from surface of said first dielectric layer;

a second doping of said intrinsic polysilicon layer, in said contact hole; and a second anneal to activate dopants in said intrinsic polysilicon layer, in said contact hole.

2. The method of claim 1, wherein said active device region, of said MOSFET device, in said semiconductor substrate, is an N type doped region.

3. The method of claim 1, wherein said first dielectric layer is silicon dioxide, deposited using LPCVD processing, at a temperature between about 400° and 800° C., to a thickness between about 6000 and 12000 Angstroms.

4. The method of claim 1, wherein said second dielectric layer is silicon nitride, deposited using LPCVD processing, at a temperature between about 600° and 800° C., to a thickness between about 500 and 3000 Angstroms.

5. The method of claim 1, wherein said contact hole is created via anisotropic RIE removal of said silicon nitride layer, using Cl2, while said first dielectric layer is removed using a CF4–CHF3 chemistry.

6. The method of claim 1, wherein said intrinsic polysilicon layer is deposited using LPCVD processing, at a temperature between about 500° and 700° C., to a thickness between about 1000 and 4000 Angstroms.

7. The method of claim 1, wherein said first doping, of said intrinsic polysilicon layer, is performed via ion implantation of arsenic, at an energy between about 30 and 100 Kev., at a dose between about 2E15 and 2E16 atoms/cm2.

8. The method of claim 1, wherein said first doping, of said intrinsic polysilicon layer, is performed via POC13 processing, at a temperature between about 850° and 950° C.

9. The method of claim 1, wherein said first anneal is performed at a temperature between about 800° and 900° C., for a time between about 10 and 40 min, in a nitrogen ambient.

10. The method of claim 1, wherein said doped polysilicon is removed using a phosphoric acid solution, at a temperature between about 160° and 180° C.

11. The method of claim 1, wherein said intrinsic polysilicon layer, in said contact hole, is doped via ion implantation of arsenic, at an energy between about 50 and 100 Kev., at a dose between about 1E15 and 3E16 atoms/cm2.

12. The method of claim 1, wherein said second anneal is performed in a nitrogen ambient, at a temperature between about 800° and 900° C.

13. A method for fabricating a MOSFET device on a semiconductor substrate, using a polysilicon plug to provide electrical contact between a source and drain device region, in said semiconductor substrate, and an interconnect metallization, comprising the steps of:

providing said MOSFET device on said semiconductor substrate;

providing said source and drain device regions in said MOSFET device;

depositing a silicon oxide layer on said semiconductor substrate, including said MOSFET device;

depositing a silicon nitride layer on said silicon oxide layer, to form composite dielectric layer;

photolithographic processing to open a region in photoresist, exposing said composite dielectric layer, directly overlying said source and drain device regions;

anisotropic removal of said composite dielectric layer, in said open region of said photoresist, to create a contact hole to said source and drain device regions;

cleaning surface of said source and drain device regions, in said contact hole;

depositing an intrinsic polysilicon layer on said source and drain device regions, in said contact hole, and on said silicon nitride layer;

depositing an insitu doped polysilicon layer on said intrinsic polysilicon layer;

a first anneal to completely convert intrinsic polysilicon layer, on said silicon nitride layer, to doped polysilicon, while converting a top portion of said intrinsic polysilicon, in said contact hole, to said doped polysilicon;

removal of said doped polysilicon, from surface of said silicon nitride layer, and from surface of intrinsic polysilicon layer, in said contact hole;

removal of said silicon nitride layer from surface of said silicon oxide layer;

doping of said intrinsic polysilicon layer, in said contact hole; and a second anneal to activate dopants in said intrinsic polysilicon layer, in said contact hole.

14. The method of claim 13, wherein said source and drain device regions, are N type doped regions.

15. The method of claim 13, wherein said silicon oxide layer is grown using LPCVD processing, at a temperature between about 400° and 800° C., to a thickness between about 6000 and 12000 angstroms.

16. The method of claim 13, wherein said silicon nitride is grown using LPCVD processing, at a temperature between about 600° and 800° C., to thickness between about 500 and 3000 Angstroms.

17. The method of claim 13, wherein said contact hole, to said source and drain device regions, is created via RIE processing, using C12 for said silicon nitride layer, and a CF4–CHF3 chemistry for said silicon oxide layer.

18. The method of claim 13, wherein said intrinsic polysilicon layer is deposited using LPCVD processing, at a temperature between about 500° and 700° C., to a thickness between about 1000 and 4000 Angstroms.

19. The method of claim 13, wherein said insitu doped polysilicon layer is deposited using LPCVD processing, at a temperature between about 500° and 700° C., to a thickness between about 1000 and 4000 Angstroms, using between about 1200 and 1400 sccm of SiH4, and between about 100 and 300 sccm of PH3.

20. The method of claim 13, wherein said first anneal is performed in a nitrogen ambient, at a temperature between about 800° and 900° C., for a time between about 10 and 40 min.

21. The method of claim 13, wherein said doped polysilicon is removed using a phosphoric acid solution, at a temperature between about 160° and 180° C.

22. The method of claim 13, wherein said intrinsic polysilicon layer, in said contact hole, is doped via ion implantation of arsenic, at an energy between about 50 and 100 Kev., at a dose between about 1E15 and 3E16 atoms/cm2.

23. The method of claim 13, wherein said second anneal is performed in an nitrogen ambient, at a temperature between about 800° and 900° C.

* * * * *